United States Patent [19]

Calabro

[11] Patent Number: 4,462,499

[45] Date of Patent: Jul. 31, 1984

[54] ADJUSTABLE CIRCUIT CARD RETAINER

[76] Inventor: Anthony D. Calabro, 8738 West Chester Pike, Upper Darby, Pa. 19082

[21] Appl. No.: 408,151

[22] Filed: Aug. 16, 1982

[51] Int. Cl.³ .............................................. H02B 1/02
[52] U.S. Cl. ...................................... 211/41; 361/399
[58] Field of Search ................. 211/41, 175, 190, 207; 361/399, 415; 248/274, 295.1

[56] References Cited

U.S. PATENT DOCUMENTS

| 3,640,399 | 2/1972 | Hartman | 211/175 |
| 3,829,741 | 8/1974 | Athey | 361/399 |
| 3,932,016 | 1/1976 | Ammenheuser | 361/415 X |
| 4,019,099 | 4/1977 | Calabro | 361/399 |

Primary Examiner—J. Franklin Foss
Assistant Examiner—Robert W. Gibson, Jr.
Attorney, Agent, or Firm—Anthony J. Casella; Gerald E. Hespos

[57] ABSTRACT

An adjustable circuit card retainer has mounting and card retaining brackets constructed from a dielectric material. The mounting bracket includes base and mounting walls disposed perpendicular to each other and a pair of parallel support walls that are perpendicular to the base and mounting walls. The card retaining bracket includes mounting and card retaining legs. The mounting leg is dimensioned to slidably move with respect to the support and mounting walls of the mounting bracket and includes a slot that slidably engages at least one boss on the mounting bracket. The card retaining leg includes a card receiving member and a top support member for engaging a circuit card. The card retaining bracket is slidably moved with respect to the mounting bracket so that the card retaining leg engages the circuit card. The card retaining bracket then is secured in position by fasteners extending through the adjustment slot into the bosses.

15 Claims, 9 Drawing Figures

ADJUSTABLE CIRCUIT CARD RETAINER

BACKGROUND OF THE INVENTION

The circuitry of electrical devices typically is disposed upon printed circuit cards mounted in the device and connected to other components therein. Many electrical devices include a plurality of printed circuit cards disposed in a complex closely spaced array.

It often is necessary to remove the circuit card to make repairs, to check reliability or to insert a new card that will cause the device to operate differently. Additionally, it is important to ensure that vibrations caused by the device or vibrations in the environment in which the device is operating will not cause failure of any electrical connections. Therefore, the printed circuit and card preferably is both removably and rigidly mounted in the device.

Several structures have been developed to enable a removable yet reasonably rigid mounting of the circuit cards. One such structure that has proved effective is the card guide shown in U.S. Pat. No. 4,019,099 issued to Anthony D. Calabro on Apr. 19, 1977. The card guide shown in U.S. Pat. No. 4,019,099 is constructed from a dielectric material, such as plastic, and includes a U-shaped channel that slidably receives and frictionally engages the card. Card guides, such as that shown in U.S. Pat. No. 4,019,099, typically are used in pairs. Thus, a card guide is disposed on each of two opposed side edges of a rectangular printed circuit card. In some electrical devices, the pairs of card guides are securely mounted in a rigid cage or frame which provides additional support. In other electrical devices, each card guide is secured to a mounting bracket which in turn is secured to the device.

The card guide shown in U.S. Pat. No. 4,019,099, and other similar card guides, are extremely effective and have been used widely throughout the industry. However, in many devices it is necessary to provide additional structural support to ensure that vibrations do not affect the electrical connections. This additional support must not significantly inhibit the removal of the card or the ability of air to flow freely around the card to dissipate heat generated by the circuitry.

The prior art includes structural members that are used with card guides and mounting brackets to more securely retain the circuit card, and thereby protect against excessive vibrations. One widely used prior art circuit card retaining structure is a generally L-shaped metallic bracket. One leg of this metallic retaining bracket engages a free edge of the printed circuit card, while the other leg includes a plurality of outwardly extending teeth that are forced into engagement with the plastic mounting bracket. More specifically, and as explained in detail below, the side of the mounting bracket opposite the card guide defines a channel. The width of the section of the card retaining bracket having teeth exceeds the width of the channel in the mounting bracket. Thus, the teeth can be forced into the walls of the channel such that the frictional engagement between the teeth and the channel holds the retaining bracket in position. This structural combination would be employed by first positioning the card retaining leg at the appropriate height with respect to the edge of the circuit card, and then urging the metallic teeth on the mounting leg into the walls of the channel.

Experience has indicated that the circuit card retaining structure described above has several disadvantages. First, it generally is undesirable to use metallic mounting members because of the possibility of causing short circuits. Second, a significant force is required to urge the metallic teeth of the mounting leg into engagement with the plastic mounting bracket. This force often results in bruised fingers and broken nails, and encourages people to use tools that are not adapted for the task and can damage the associated electrical components. Third, it is difficult to remove a circuit card from the prior art retaining bracket described above. Specifically, to remove a card from the prior art assembly, the card retaining legs of the metal brackets in each pair must be urged away from one another. This force exerted on the metal card retaining bracket causes the mounting legs to bend away from the card. After the legs have bent sufficiently, the card can be slid out of engagement with the card guide without contacting the retaining bracket. However, the retaining brackets in each pair must be bent in the manner described above simultaneously to properly remove the card. This tas requires a substantial amount of dexterity under any circumstances, and is particularly difficult for large circuit cards. Finally, it often is necessary to remove the retaining bracket entirely either to facilitate the removal of the cirucit card, to accommodate a replacement card of a different size, or to correct an initial incorrect positioning of the retaining bracket. However, once the teeth of the retaining bracket are forced into engagement with the mounting bracket, it is difficult to force them out of engagement. Therefore, the height of the retaining bracket cannot be readily adjusted, and it occasionally is necessary to discard a perfectly good combination of retaining and mounting brackets because the retaining bracket is not positioned at the proper height.

In view of the above, it is an object of the subject invention to provide an adjustable circuit card retainer that will enable secure mounting of a circuit card in an electrical device.

It is another object of the subject invention to provide an adjustable circuit card retainer that enables easy removal and replacement of the circuit card.

It is a further object of the subject invention to provide an adjustable circuit card retainer that can be readily reused on circuit cards of different sizes.

It is still another object of the subject invention to provide an adjustable circuit card retainer that can be used and reused without damaging any of the parts related to it.

It is still a further object of the subject invention to provide an adjustable circuit card retainer that does not have the potential for causing short circuits.

It is still an additional object of the subject invention to provide an adjustable circuit card retainer that can be manufactured inexpensively.

SUMMARY OF THE INVENTION

The subject adjustable circuit card retainer includes a mounting bracket and a card retaining bracket, both of which are constructed from an electrically non-conductive material, such as plastic. This plastic construction eliminates short circuits and reduces manufacturing costs. The mounting bracket includes substantially rectangular base and mounting walls. The base and mounting walls are disposed orthogonally to one another, and rigidly are connected along a common edge. A pair of substantially parallel support walls extend from and are connected to both the base and mounting walls.

A channel is defined on the mounting bracket between the pair of support walls. The surface of the mounting wall in this channel includes at least one mounting boss. As explained below, the mounting bosses cooperate with fasteners such as mounting screws to fix the height of the card retaining bracket.

The card retaining bracket is a substantially L-shaped structure including a mounting leg and a card retaining leg. The mounting leg defines an elongated rectangle having a slot extending along its longitudinal axis. The width of the mounting leg substantially equals the distance between the support walls on the mounting bracket, and a the width of the slot in the mounting leg substantially equals the width of the mounting boss. Thus, the card retaining bracket may be positioned in the channel of the mounting bracket with the mounting bosses extending through the slot. In this manner, the card retaining bracket may slidably move against the mounting wall toward or away from the base wall of the mounting bracket. Fasteners such as mounting screws having head portions wider than the slot in the card retaining bracket extend through the slot and into the mounting bosses. These fastening devices securely fix the card retaining bracket to the mounting bracket at a desired location with respect to the base wall thereof.

The card retaining leg of the card retaining bracket includes a card receiving member and a top support member. The card receiving member preferably is perpendicular to the adjustable mounting leg and includes a notch for engaging the circuit card. The top support member of the card retaining leg extends across at least a portion of the card receiving notch to engage an edge of the printed circuit card.

In use, a card guide, such as that shown in U.S. Pat. No. 4,019,099, is affixed to the surface of the mounting wall opposite support walls. The base wall of the mounting bracket then is securely mounted onto an appropriate surface of the electrical device. The printed circuit card then is slidably inserted through the track in the card guide and the appropriate electrical connections in the device are made. The mounting leg of the card retaining bracket then is slidably inserted into the channel of the mounting bracket. The card retaining bracket is positioned in the channel such that the top of the circuit card is firmly engaged by the card receiving notch and the top support member. Once this proper positioning is attained, the mounting and card retaining brackets are secured together.

The circuit card easily can be removed from the subject retainer and reused in a manner described in detail below.

DETAILED DESCRIPTION OF THE PREFERRED EMBODIMENT

Figure 1:
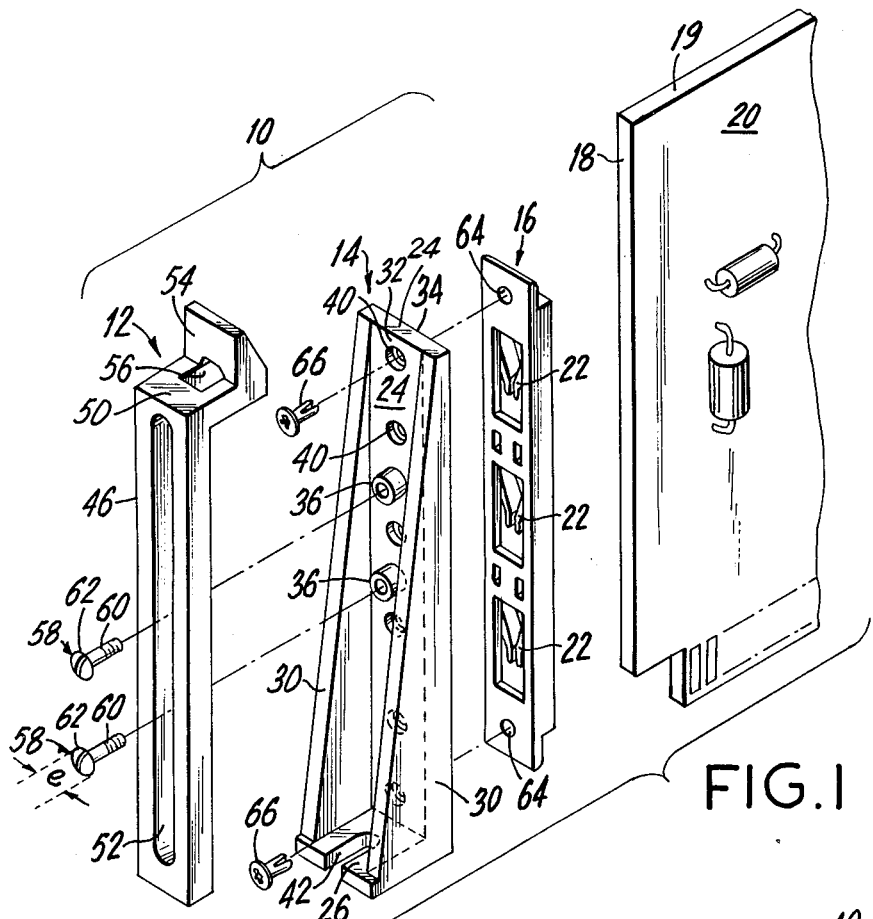
FIG. 1 is an exploded perspective view of the subject adjustable circuit card retainer used with a card guide and a circuit card.

The adjustable circuit card retainer, indicated generally by the numeral 10 in FIG. 1, includes a card retaining bracket 12 and a mounting bracket 14. Typically, the adjustable circuit card retainer 10 is used with a card guide 16 which slidably receives at least a portion of side edge 18 of printed circuit card 20. Although a variety of card guides can be used with the adjustable circuit card retainer 10, the card guide 16, illustrated in FIG. 1, employs a plurality of pairs of resilient fingers 22 which frictionally but releasably engage the side edge 18 of printed circuit card 20.

Generally, printed circuit card 20 is a rectangular structure having a second side edge substantially parallel to side edge 18. This second side edge (not shown) of the printed circuit card 20 similarly would be engaged by a card guide and an adjustable card retainer in the manner described herein.

Figure 2:
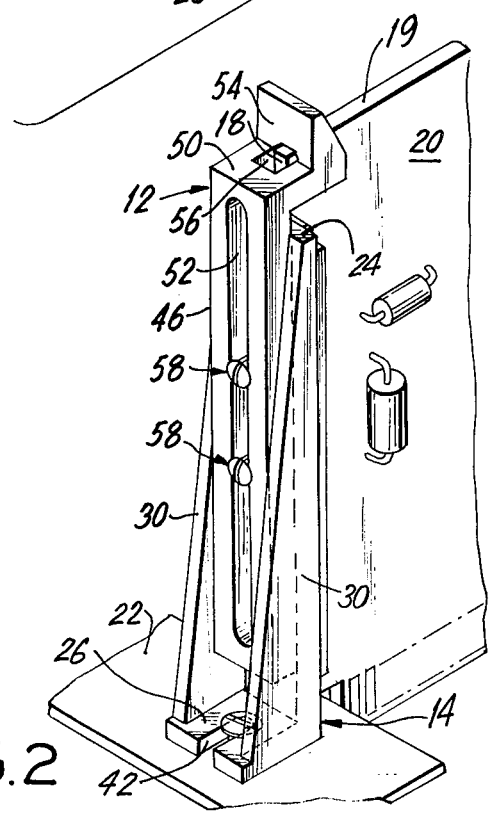
FIG. 2 is a perspective view of the subject adjustable circuit card retainer used with a card guide and a circuit card.
Figure 3:
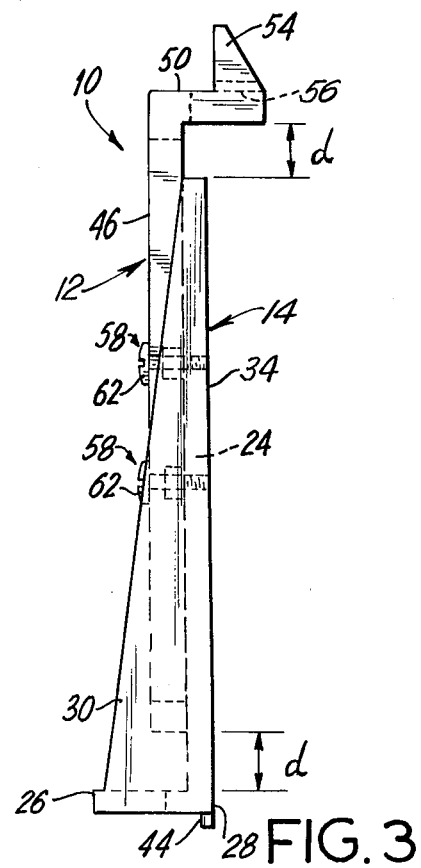
FIG. 3 is a side elevational view of the subject adjustable circuit card retainer.
Figure 4:
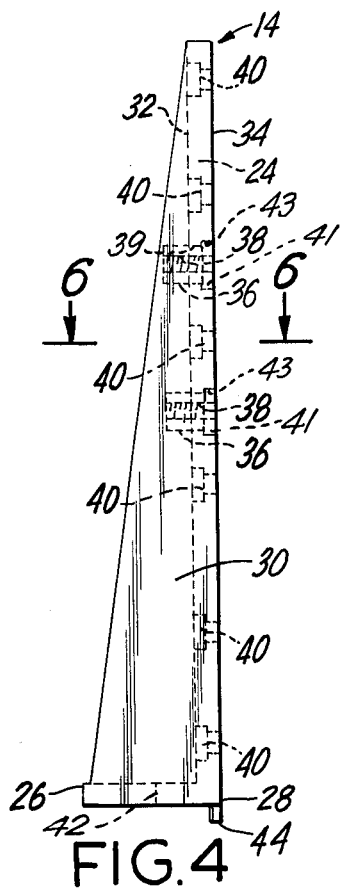
FIG. 4 is a side elevational view of the mounting bracket of the subject adjustable circuit card retainer.
Figure 5:
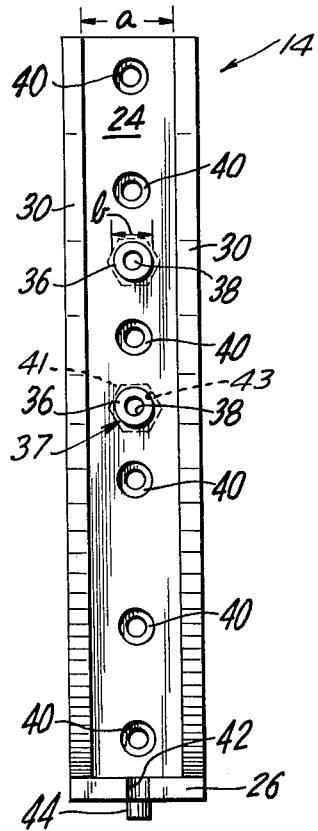
FIG. 5 is a front elevational view of the mounting bracket of the adjustable circuit card retainer.

As illustrated in FIGS. 1 through 3, card guide 16 and card retaining bracket 12 mount on opposed sides of mounting bracket 14 and cooperate with one another to securely but releasably retain card 20. Mounting bracket 14, as illustrated most clearly in FIGS. 4 through 6, includes substantially rectangular mounting and base walls 24 and 26 respectively. Mounting wall 24 and base wall 26 are connected one another along their common end edge 28, and are disposed orthagonally with respect to one another. Support walls 30 are parallel to one another, and separated by distance "a" as indicated in FIG. 5. More particularly, support walls 30 connect to and extend perpendicularly from both mounting wall 24 and base wall 26. Preferably, each support wall 30 is substantially triangular as shown most clearly in FIG. 4.

Figure 9:
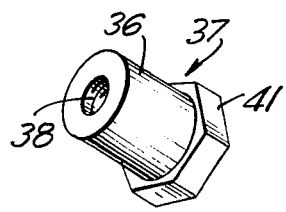
FIG. 9 is a perspective view of a stud mountable in the subject mounting bracket.

Mounting wall 24 includes opposed inner and outer mounting surfaces 32 and 34 respectively. At least boss 36 extends from the inner mounting surface 32 of mounting wall 24 centrally between support walls 30. Each boss 36 has a diameter indicated by dimension "b", in FIG. 5, and includes bracket aperture 38 which extends centrally through each boss 36. The bosses 36 may be molded integrally with mounting bracket 14. However, it is preferable that each boss 36 define an end of stud 37 which is formed separately for insertion into boss apertures 39 in mounting bracket 14. More particularly, as shown in FIG. 9, each stud 37 is provided with the cylindrical boss 36 on one end and an opposed non-cylindrical (e.g., hexagonal) end 41. The cylindrical boss 36 cooperates with the card retaining bracket 12, as explained below. The non-cylindrical end 41 of stud 37 is non-rotatably mounted in a correspondingly shaped non-cylindrical counter sunk aperture 43 adjacent and coaxial with aperture 39 in the mounting bracket 14. The stud 37 preferably is formed from either plastic or metal. Mounting wall 24 also includes a plurality of counter-sunk through apertures 40 centrally located between side walls 30.

Base wall 26 includes a notch 42 which is parallel to and centrally located between side walls 30. Notch 42 accepts a fastening member, such as a screw for securing mounting member 14 to the electrical device in which mounting bracket 14 is used. Base wall 26 also includes a positioning protrusion 44 which is inserted into an appropriate aperture in the electrical device to assure proper positioning of mounting bracket 14.

Figure 6:
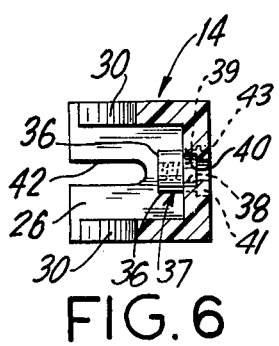
FIG. 6 is a top view partially in section of the mounting bracket of the subject adjustable circuit card retainer taken through section 6—6 as shown in FIG. 4.
Figure 7:
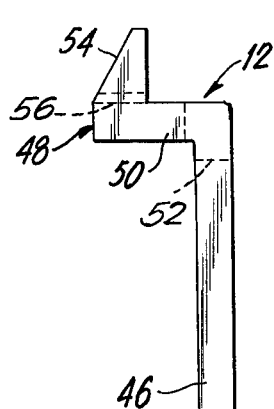
FIG. 7 is a side elevational view of the card retaining bracket of the subject adjustable circuit card retainer.
Figure 8:
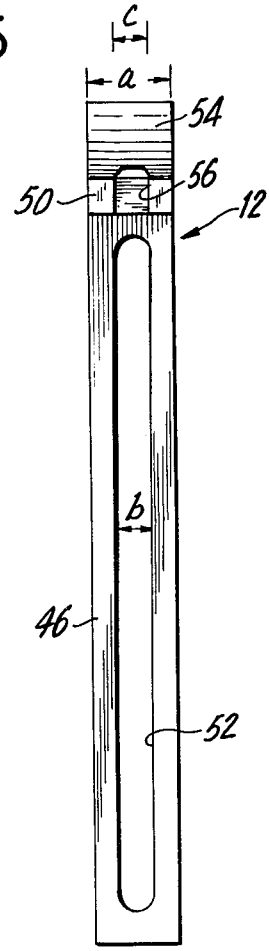
FIG. 8 is a front elevational view of the card retaining bracket of the adjustable circuit card retainer.

Turning to FIGS. 7 and 8, the card retaining bracket 12 is a generally L-shaped member having a mounting leg 46 and a card retaining leg 48. The mounting leg 46 is an elongated rectangular member having a width "a" substantially equal to the distance between support walls 30. Adjustment slot 52 is centrally located about the longitudinal axis of mounting leg 46 and extends along a substantial part of its length. The width of adjustment slot 52, as defined by dimension "b" in FIG. 8, substantially corresponds to the diameter of the bosses 36, as shown in FIGS. 5 and 6.

The card retaining leg 48 includes a card receiving member 50 and a top support member 54. The card receiving member 50 is a substantially rectangular structure connected to and extending perpendicularly away from mounting leg 46. A card receiving notch 56 extends centrally into card receiving member 50 from the edge thereof opposite mounting leg 46. The width of card receiving notch 56, as indicated by dimension "c" in FIG. 8 substantially corresponds to the thickness of printed circuit card 20.

Top support member 54 of card retaining leg 48 is connected to and extends perpendicularly from card receiving member 40. More particularly, top support member 54 extends from the side of card receiving member 50 opposite mounting leg 46. As illustrated most clearly in FIG. 8, top support member extends entirely across card receiving notch 56.

Returning to FIGS. 1 through 3, the subject adjustable circuit card retainer 10 is employed by first positioning mounting bracket 14 on electrical device 22 and securing it in that position. Next, card guide 16 is positioned against outer surface 34 of mounting wall 24 such that apertures 64 in card guide 16 are aligned with an appropriate set of counter sunk apertures 40 in mounting bracket 14. Plastic rivets 66 then are inserted into counter sunk apertures 32 and apertures 64 to securely mount card guide 15 against outer surface 34 of mounting wall 24.

Printed circuit card 20 then is slidably inserted into card guide 16 such that side edge 18 of card 20 is frictionally engaged by spring fingers 22.

Card retaining bracket 12 then is positioned adjacent inner surface 32 of mounting wall 24 on the mounting bracket 14, such that the card retaining leg 48 extends across mounting wall 24. As explained above, the width "a" of card retaining bracket 12 substantially equals the distance between support walls 30 of mounting bracket 14. Additionally, the width "b" of adjustment slot 52 substantially equals the diameter of bosses 36 on mounting bracket 14. Thus, card retaining bracket 12 is placed in slidable communication with mounting wall 24 and support walls 30 of mounting bracket 14. Bosses 36 also are in slidable communication with adjustment slot 52 on card retaining bracket 12. This structure enables the height of card retaining leg 48 relative to base wall 26 to be adjusted by slidably moving card retaining bracket 12 with respect to mounting bracket 14. Preferably, the distance from card receiving member 50 to the opposed end of mounting leg 46 equals the distance from base wall 26 to the opposed end of mounting wall 24. This relationship results in the distances "d" shown in FIG. 3 being equal to one another, thereby enabling an optimum range of adjustments.

A pair of mounting screws 58 are provided, each including a penetrating portion 60 and a head portion 62. Penetrating portion 60 of mounting screws 58 are dimensioned to be securely received in mounting apertures 38 on bosses 36. Head portion 62 of each mounting screw 58 has a width indicated by dimension "e" in FIG. 1, which is greater than the width "b" of adjustment slot 52. Thus, penetrating portion 60 can extend through adjustment slot 52 for secure mounting in apertures 38 of bosses 36. Appropriate rotation of mounting screws 58 then will cause head portions 62 thereof to tighten against mounting leg 46 to securely position card retaining bracket 12 at an appropriate height with respect to mounting bracket 14.

The card 20 can be removed from the subject adjustable card retainer 10 in any of several ways. For example, as with the prior art arrangement, the card retaining brackets 12 may be urged away from one another a sufficient distance to enable card 20 to be free of top support member 54. The card 20 then can be slidably removed from card guide 16. However, as explained above, removal of card 20 in this manner can be difficult, particularly for large dimensioned cards. The subject adjustable circuit card retainer 10, unlike the prior art structures, also enables cards to be removed in an easier manner. Specifically, card 20 can be removed readily from the adjustable circuit card retainer 10 by simply loosening mountinng screws 58 a sufficient amount to enable movement of card retaining bracket 12 within mounting bracket 14. After the mounting screws 58 on one card retaining bracket 12 have been loosened, that card retaining bracket 12 may be bent away from card 20 a sufficient distance to enable top support member 54 to be clear of card 20. The card retaining bracket 12 then may be slidably moved toward base wall 26 of mounting bracket 14 so that the top support member 54 will merely be adjacent side edge 18 of card 20 rather than engaging top edge 19 thereof. The other card retaining bracket 12 on the opposite side edge of card 20 then merely may be bent out of engagement with card 20 with one hand, while card 20 is slidably removed from card guide 16 with the other hand. As an alternative, both card retaining brackets 12 retaining a card 20 may be loosened in the manner described above, or one or both may be entirely removed from mounting bracket 14. If the replacement circuit card is of a different size than the one originally used in the device, the card retaining bracket 12 merely has to be affixed to the mounting bracket 14 at a different height.

In summary, an adjustable circuit card retainer is provided including a mounting bracket and a card retaining bracket. The card retaining bracket is slidably positioned between opposed support walls of the mounting bracket and slidably abuts a mounting wall on the mounting bracket. The card retaining bracket further includes an elongated adjustment slot which slidably engages bosses on the mounting bracket. A card retaining leg on the card retaining bracket includes a card receiving member and a top support member. The card receiving member includes a card receiving notch adjacent the top support member and dimensioned to accept the circuit card. The card retaining bracket is positioned with respect to the mounting bracket so that the card receiving notch and top support member firmly engage the top edge of the circuit card. Mounting screws inserted through the adjustment slot and into the bosses securely but releasably attach the card retaining bracket to the mounting bracket thus enabling the top support member to securely retain the circuit card. The adjustable circuit card retainer is constructed from an electrically non-conductive material, such as plastic, and as a result is inexpensive to manufacture and eliminates the possibility of short circuits. The subject adjustable circuit card retainer is adaptable for use with circuit cards of various heights and enables easy removal and replacement of circuit cards.

While the preferred embodiment of the subject invention has been described and illustrated, it is obvious that various changes and modifications can be made therein without departing from the spirit of the present invention which should be limited only by the scope of the claims.

What is claimed is:

1. An adjustable circuit card retainer for releasably retaining a printed circuit card in an electrical device, said adjustable circuit card retainer comprising:
   a mounting bracket formed from an electrically non-conductive material, said mounting bracket including a mounting wall having at least one side edge extending between and connecting a planar first surface and an opposed second surface, a base wall rigidly connected to and extending from said mounting wall perpendicular to the first surface thereof, and at least one boss extending from said first surface of said mounting wall;
   a card retaining bracket formed from an electrically non-conductive material, said card retaining bracket including an elongated rectangular mounting leg having a planar first surface and an opposed second surface, said mounting leg including an elongated slot extending through said mounting leg from the first to the second surfaces thereof, said card retaining bracket further including a card retaining leg connected to and extending perpendicularly from said first surface of said mounting leg and including a card receiving notch, said first surfaces of said mounting and card receiving brackets respectively being in face to face slidable contact such that said boss extends through and is slidable in said slot and such that said card retaining leg extends across one said edge of said mounting wall; and
   at least one fastener releasably securing said card retaining bracket to said mounting bracket whereby when the mounting bracket is mounted in the electrical device, said card retaining bracket may be slidably moved with respect to said mounting bracket such that said card receiving notch engages the circuit card, thereby enabling said fastener to secure said card retaining bracket to said mounting bracket to securely retain the circuit card in the electrical device.

2. An adjustable circuit card retainer as in claim 1 wherein said mounting bracket includes a pair of parallel support walls extending perpendicularly from and connected to both said base wall and the first surface of said mounting wall, said boss being disposed on said first surface of said mounting wall centrally between said support walls.

3. An adjustable circuit card retainer as in claim 2 wherein the elongated rectangular mounting leg includes opposed pairs of end and side edges, said slot being disposed centrally between and parallel to said side edges of said mounting leg, the distance between said opposed side edges of said adjustable mounting leg being substantially equal to the distance between said support walls of said mounting bracket, such that said mounting leg is in slidable engagement with said mounting wall and said support walls.

4. An adjustable circuit card retainer as in claim 2 wherein said boss defines a cylinder, the longitudinal axis of which is perpendicular to said mounting wall first surface, the diameter of said cylindrical boss being substantially equal to the width of said slot.

5. An adjustable circuit card retainer as in claim 4 wherein said fastener is a screw having a head portion wider than said slot, and wherein said boss includes an aperture for receiving said screw.

6. An adjustable circuit card retainer as in claim 3 wherein said mounting wall is an elongated rectangle having opposed pairs of end and side edges, and wherein said base wall is connected to said mounting wall adjacent one said end edge thereof.

7. An adjustable circuit card retainer as in claim 6 wherein said card retaining leg is perpendicular to the longitudinal axis of said mounting leg, and wherein said slot is disposed intermediate one said end edge of said mounting leg and said card retaining leg.

8. An adjustable circuit card retainer as in claim 7 wherein the distance from said base wall to the opposed end edge of said mounting wall substantially equals the distance from said card retaining leg to the first end edge of said mounting leg.

9. An adjustable circuit card retainer as in claim 3 wherein said card retaining leg includes a substantially rectangular card receiving member having opposed pairs of end and side edges extending between and connecting opposed first and second surfaces, said card retaining leg being connected to the first surface of the mounting leg along a first end edge of said card receiving member, said card receiving notch extending entirely through said card receiving member from the first to the second surfaces thereof, said card receiving notch being disposed centrally between the side edges of said card receiving member and extending from the second end edge thereof to a point intermediate said end edges.

10. An adjustable circuit card retainer as in claim 9 wherein said card retaining leg includes a top support member extending across said card receiving notch, whereby said mounting leg may be slidably moved with respect to said mounting bracket to enable said card receiving notch and said top support member to securely retain said circuit card in the electrical device.

11. An adjustable circuit card retainer as in claim 1 wherein said card retaining bracket and said mounting bracket are formed from unitary pieces of electrically non-conductive material.

12. An adjustable circuit card retainer as in claim 11 wherein said electrically non-conductive material is plastic.

13. An adjustable circuit card retainer as in claim 1 further including a stud having opposed cylindrical and non-cylindrical ends, and wherein the mounting wall of the mounting bracket includes a non-cylindrical aperture corresponding in size and configuration to the non-cylindrical end of said stud, said non-cylindrical end of said stud being non-rotatably mounted in said non-cylindrical aperture such that said cylindrical end of said stud extends from said first surface of said mounting wall to define the boss.

14. An adjustable circuit card retainer as in claim 13 wherein said stud is made of metallic material.

15. An adjustable circuit card retainer as in claim 13 wherein said non-cylindrical end of said stud and said non-cylindrical aperture in said mounting bracket are hexagonal.

* * * * *